United States Patent [19]
Matsumoto et al.

[11] Patent Number: 5,023,913
[45] Date of Patent: Jun. 11, 1991

[54] APPARATUS FOR CHANGING A SOUND FIELD

[75] Inventors: Masaharu Matsumoto, Hirakata; Katsuaki Satoh, Osaka; Seiichi Ishikawa; Mitsuhiko Serikawa, both of Hirakata; Akihisa Kawamura, Hirakata; Hikari Hashimoto, Kobe, all of Japan

[73] Assignee: Matsushita Electric Industrial Co., Ltd., Osaka, Japan

[21] Appl. No.: 358,282

[22] Filed: May 26, 1989

[30] Foreign Application Priority Data

| May 27, 1988 | [JP] | Japan | 63-130670 |
| May 27, 1988 | [JP] | Japan | 63-130671 |
| May 27, 1988 | [JP] | Japan | 63-130672 |
| May 27, 1988 | [JP] | Japan | 63-130673 |
| Aug. 31, 1988 | [JP] | Japan | 63-216561 |
| Sep. 30, 1988 | [JP] | Japan | 63-248120 |

[51] Int. Cl.$^5$ .............................................. H04S 1/00
[52] U.S. Cl. ................................................ 381/63; 381/1
[58] Field of Search ......................... 381/1, 17, 63, 123

[56] References Cited

U.S. PATENT DOCUMENTS

| 4,157,511 | 6/1979 | Laupman | 381/63 |
| 4,389,915 | 6/1983 | Bione | 381/63 |
| 4,792,974 | 12/1988 | Chace | 381/1 |

Primary Examiner—Forester W. Isen
Attorney, Agent, or Firm—Panitch Schwarze Jacobs & Nadel

[57] ABSTRACT

An apparatus for changing a sound field, comprising at least two signal processing means, which can smoothly and continuously switch a sound field into an arbitrary sound field without a break of signals by alternately switching one of the signal processing means into the other.

14 Claims, 14 Drawing Sheets

APPARATUS FOR CHANGING A SOUND FIELD

BACKGROUND OF THE INVENTION

1. Field of the Invention:

This invention relates to an audio apparatus which handles digital audio signals reproduced from compact discs, digital audio tapes, and the like, and more particularly relates to a sound field reproducing apparatus for reproducing in an ordinary room a sound field equivalent to that of a concert hall or the like.

2. Description of the Prior Art:

Recently, sound field reproduction has been attracting attention in the audio entertainment field. Sound field reproducing apparatus for recreating the sound field of concert halls and the like in an ordinary room have been developed. A conventional sound field reproducing apparatus comprises: a signal input unit for receiving digital audio signals reproduced from compact discs and the like; a signal processing unit for processing the input signals by performing time delay and feedback operations on them according to a specified procedure; a processing instruction unit for instructing the signal processor how to process the input signals; a system controller for modifying the signal processing instructions; and a signal output unit for outputting the digital signals from the signal processing unit.

The operation of the conventional sound field reproducing apparatus configured as mentioned above will be described below. The signals received by the signal input unit are processed by the signal processing unit according to the instructions indicated by the processing instruction unit, and converted to signals which are suitable for a certain sound field. Then, the outputs from the signal processing unit are supplied to an external digital-analog converter through the signal output unit so that they are converted to analog signals. Then these analog signals are audibly reproduced with a plurality of power amplifiers and loud speakers to reproduce, a desired sound field. For example, when the input signal is an impulse signal shown by (a) in FIG. 14, it is possible for the signal processing unit to make a plurality of impulse trains such as (b), (c), (d) and (e) of FIG. 14 of the signal to be input in each loud speaker, by performing time delay and adding operations. These impulse trains may be representative of initial reflected sounds of a certain sound field.

There are other types of sound field reproducing apparatus which can vary the state of a sound field to be reproduced. Such an apparatus for modifying a sound field generally comprises: a digital audio signal input unit; a signal processing unit for processing the digital input signals in a certain way to attain the sound field characteristics to be reproduced; a processing procedure memory for storing the processing procedures according to which the signal processing unit processes the input signals; a system controller for modifying the processing procedure sent from the processing procedure memory to the signal processing unit and for providing overall controls of the system operation; and a signal output unit for outputting the digital signals.

In such a conventional apparatus for changing a sound field, the digital signals received by the signal input unit are processed by the signal processing unit according to the processing procedure sent from the processing procedure memory. Then, the outputs of the signal processing unit are passed through the signal output unit, and converted to analog signals by an external D/A converter. These analog signals are then connected with amplifiers and speakers and the like so that they are rendered audible in a target sound field. When the characteristics of the sound field to be reproduced are to be changed, control codes are sent from the system controller to the processing procedure memory to change the processing procedure. Upon reception of the codes, the processing procedure memory transfers associated sound field data to the signal processing unit. The subsequent operation same as described above is conducted to change the reproduced sound field.

These conventional apparatuses for changing a sound field are problematical in that, when a processing procedure is changed for continuous shifting of the state of a reproduced sound field, a noise occurs in the output signals at a change from one procedure to another. This noise is attributable to the discontinuity of signals, etc. To prevent this problem from arising, the signals are cut off at a point of occurrence of the noise. Therefore, it has been impossible to change the sound field continuously without producing a break in signal output.

SUMMARY OF THE INVENTION

Accordingly, it is an object of this invention to provide an apparatus for changing a sound field which can continuously and smoothly attain the movement, perspective, and spaciousness of the sound field, movement of the listening point, movement and rotation of the sound image, changes in the filter coefficient, etc., by smoothly providing continuous transition in the sound field with use of a memory having a small capacity.

In order to attain this object, this invention comprises of an input means for receiving digital audio signals from compact discs and the like, a plurality of signal processing means for processing the input digital signals by performing time delay and feed back operations on them according to a specified procedure, a processing instruction means for giving instruction of processing procedures to the signal processing means, a signal switching means for smoothly switching a plurality of signals output from said signal processing means at the time of a change in the processing procedure, and a system control means for modifying the instructions of the processing instruction unit and for controlling the signal switching means. The processing procedure not of the first signal processing means whose outputs are passed on by the signal output means but of the second signal processing means whose output signals are not passed on by the signal output means is changed into a processing procedure corresponding to the sound field to be reproduced next. After the output signals from the second signal processing means having the changed processing procedure are stabilized in a noise-free state, the sum of the signal from the first and second signal processing means is output. In this case, the output signals from the first signal processing means are gradually reduced while those from the second signal processing means are gradually increased until the latter alone are output in the end. As this procedure is carried out in sequence, sound fields change continuously without a noise at transition from one sound field to the next.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
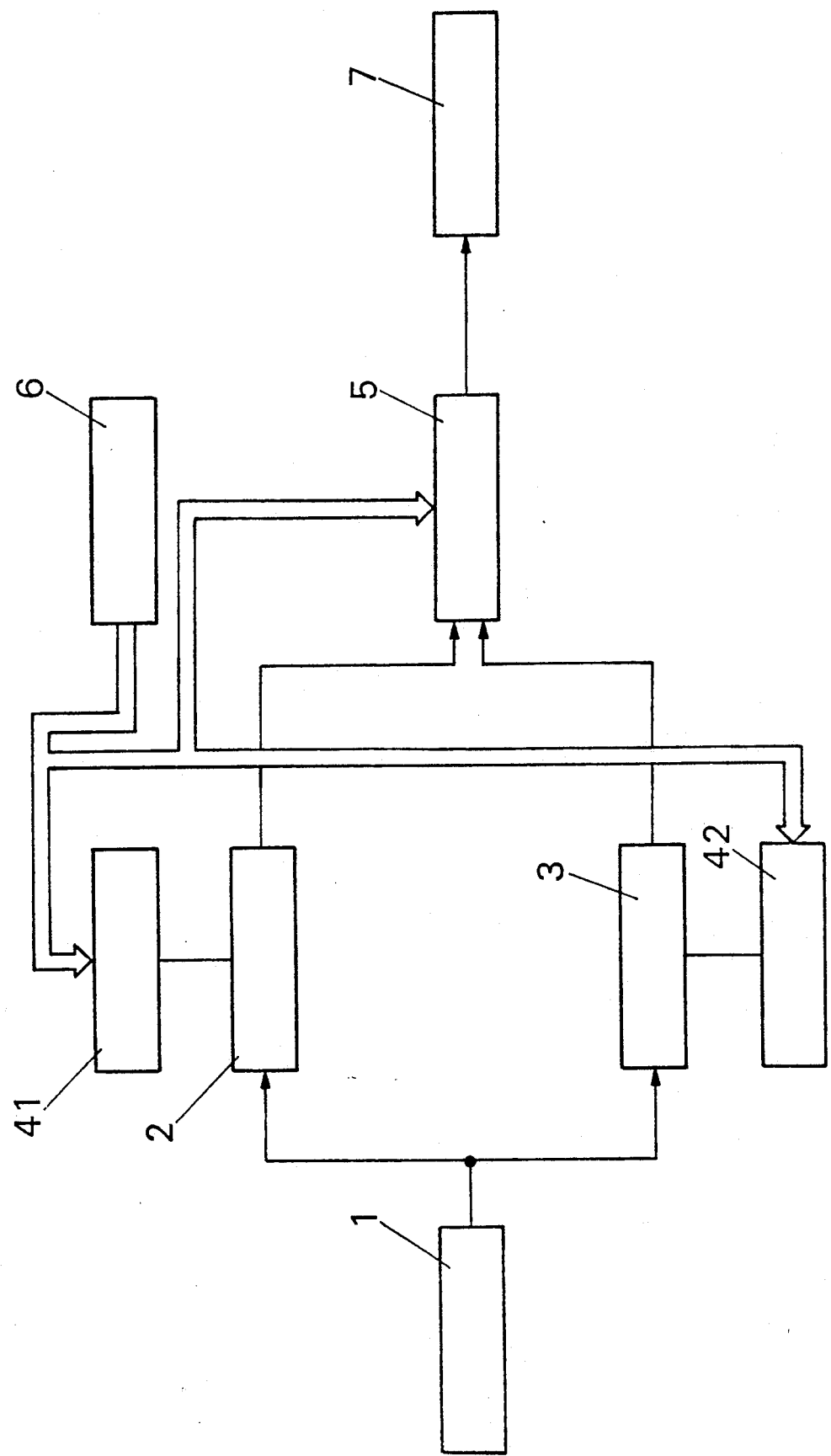
FIG. 1 is a block diagram of an apparatus for changing a sound field of a first example of this invention.

FIG. 1 is a block diagram of an apparatus for changing a sound field of the first example of this invention. The reference numeral 1 is a signal input unit for receiving digital audio signals, 2 denotes a first signal processing unit which processes the signals by performing time delay and feedback operations on the digital input signals according to a specified procedure, 3 denotes a second signal processing unit which processes the signals by performing time delay and feedback operations on the input signals according to a specified procedure in the same way as in the first signal processing unit, 41 and 42 are processing instruction units for giving instructions for processing procedures to the signal processors, 5 denotes a signal switching unit for switching smoothly a plurality of output signals from the signal processing units 2 and 3 at the time of a change in the processing procedure, 6 denotes a system controller for modifying the instructions of the processing instruction units 41 and 42 and for controlling the signal switching unit 5, and 7 denotes a signal output unit for delivering the digital output signals from the signal switching unit 5 to the outside.

The operation of the apparatus for changing a sound field of FIG. 1 will be described below. When a certain sound field is realized by the system shown in FIG. 1, the digital input signals are processed by the first signal processing unit 2 according to a processing procedure specified in the processing instruction unit 41, and then output through the signal switching unit 5 and signal output unit 7 to attain a desired sound field. In this case, the output signals from the second signal processing unit 3 are supplied to the signal switching unit 5 but not passed on farther to the signal output unit 7.

When sound field data are to be changed, the system controller 6 modifies the contents of the processing instruction unit 42 in such a way that instructions of a processing procedure corresponding to the next sound field are given to the second signal processing unit 3. After the output signals from the second signal processing unit 3 having the modified processing procedure are stabilized in a noise-free state, the system controller 6 instructs the signal switching unit 5 to carry out signal switching. In the switching unit 5, the output signals from the first and second signal processing units 2 and 3 are added while the level of the signals from the former responsible for the current sound field is reduced and the level of the signals from the latter for the next sound field increased both gradually until the signals from the second signal processing unit 3 alone are output finally. In this way, the signals are switched smoothly without producing any break. The above operation is performed alternately on the first and second signal processing units 2 and 3, so that sound fields can be changed without causing noises or a break in transition from one to the next. In this example, it is preferable to set the signal switching time as several tens of milliseconds.

Figure 2:
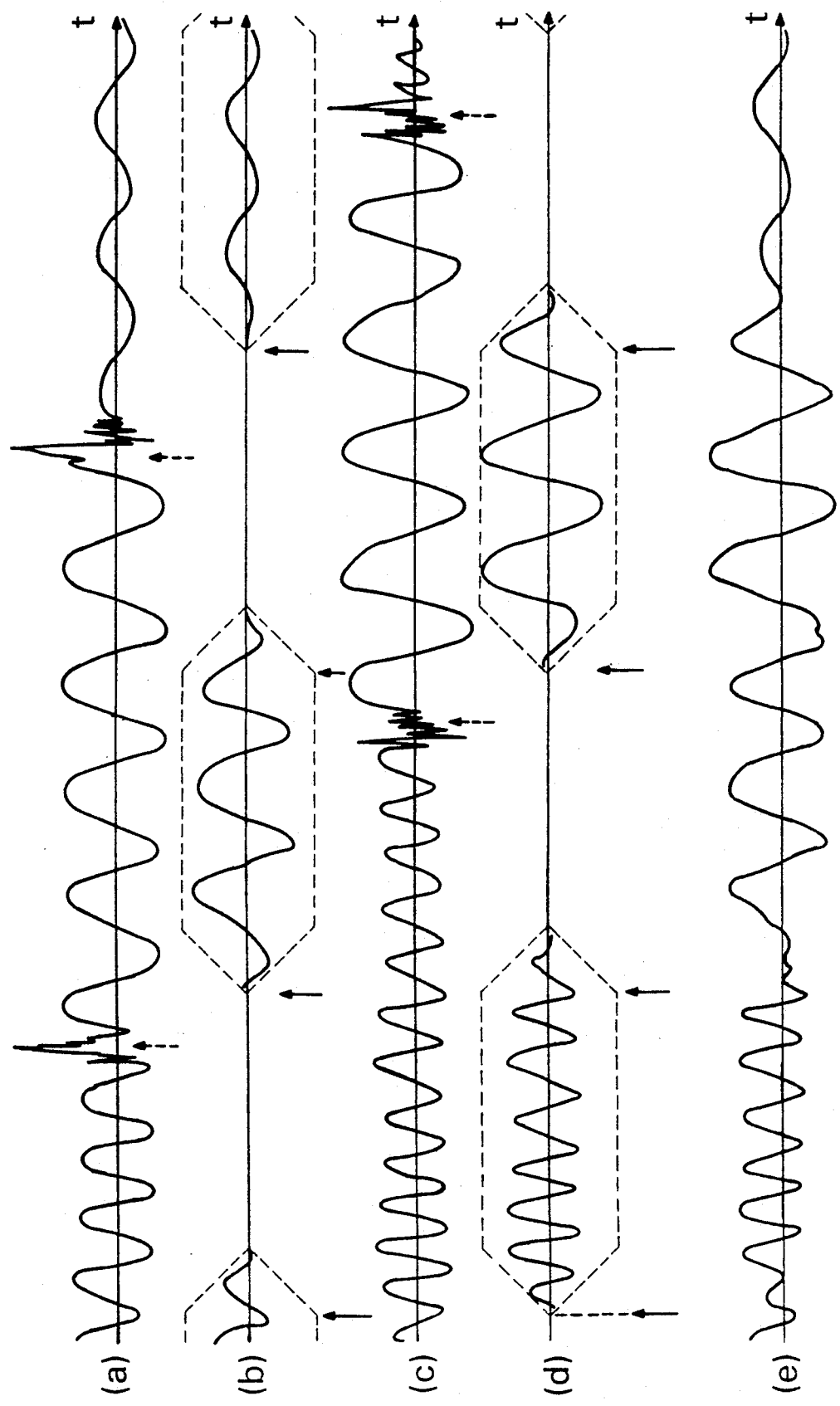
FIG. 2 shows wave forms of signals in the first example shown in FIG. 1.

FIG. 2 shows the state of signals in the first example. (a) shows the waveform of the output signal from the first signal processing unit 2, and (c) shows the waveform of the output signal from the second signal processing unit 3. The noises attributable to a change in the processing procedure are indicated by the arrows of broken line in (a) and (c). (b) shows signal components output from the first signal processing unit 2, among the output signals of the signal switching unit 5. Similarly, (d) shows the signal component output from the second signal processing unit 3 in the output signals of the signal switching unit 5. In the signal switching unit 5, the signals (b) and (c) are added to form the signal (e), which is output from the signal switching unit 5. This output signal from the signal switching unit 5 does not contain noises due to switching. It is also free from any breaks. The duration of signal switching instruction from the system controller 6 is indicated by the arrows of solid line.

Figure 3:
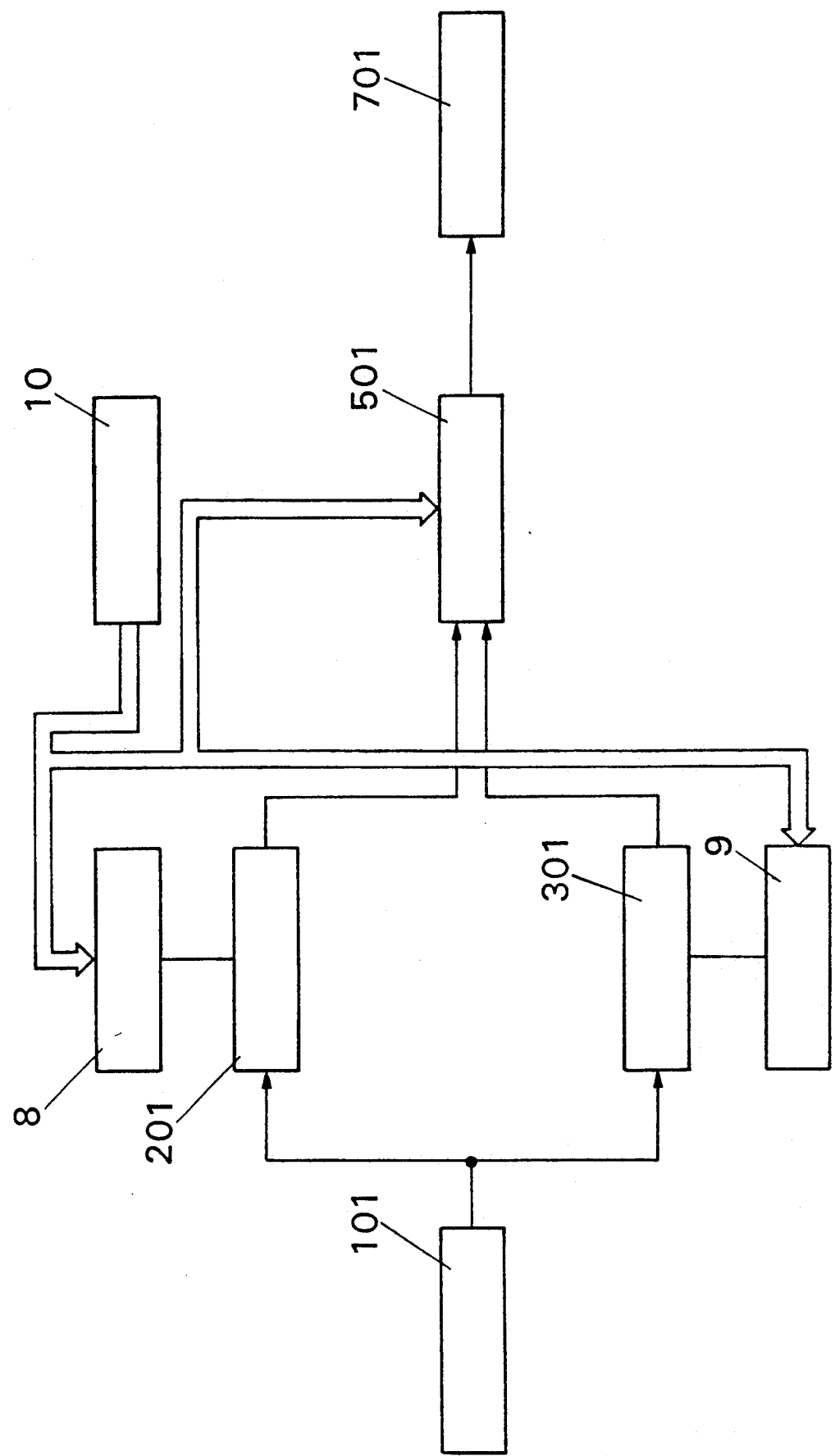
FIG. 3 is a block diagram of an apparatus for changing a sound field of a second example of this invention.

FIG. 3 is a block diagram of an apparatus for changing a sound field of the second example of this invention, the configuration of which is the same as that of the first example. The reference numeral 101 is the signal input unit for receiving digital audio signals, 201 is the first signal processing unit for processing the digital input signals by performing time delay and feedback operations according to a specified procedure on them, 301 is the second signal processing unit which operates in the same way as in the first signal processing unit 201, 8 is the first processing instruction unit which gives instructions for a signal processing procedure to the signal processing unit, 9 is the second processing instruction unit, 501 is the signal switching unit for switching output signals between the first signal processing unit 201 and the second signal processing unit 301, 10 is the system controller for transferring codes for processing procedure selection to the first and second processing instruction units 8 and 9 and for controlling the signal switching unit 501, and 701 is the digital signal output unit.

The operation of the apparatus for changing a sound field of the second example will be described below. In the case of normal operation of the apparatus for changing a sound field shown in FIG. 3, the signals from the signal input unit 101 are processed by the signal processing unit 201 according to the processing procedure set in the first processing instruction unit 8. The signal switching unit 501 selects the output signals from the first signal processing unit 201, and selected signals are output from the signal output unit 701. In this case, the second signal processing unit 301 operates in the same way as in the first signal processing unit 201 to select a processing procedure. The signal switching unit 501 selects the signals from the first signal process unit 201 to output them.

Figure 4:
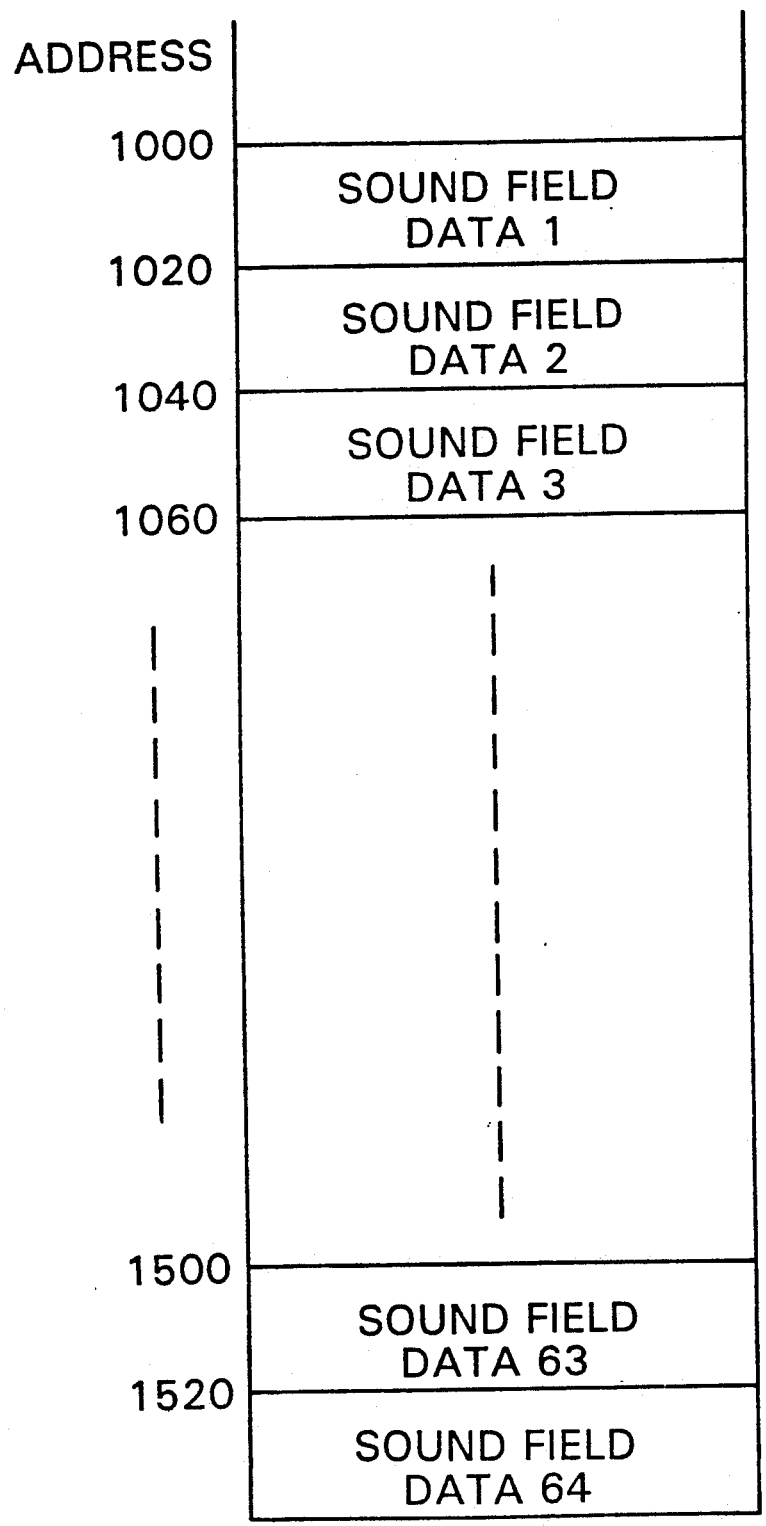
FIG. 4 is a memory map of a processing instruction means of the second example of this invention.
Figure 5:
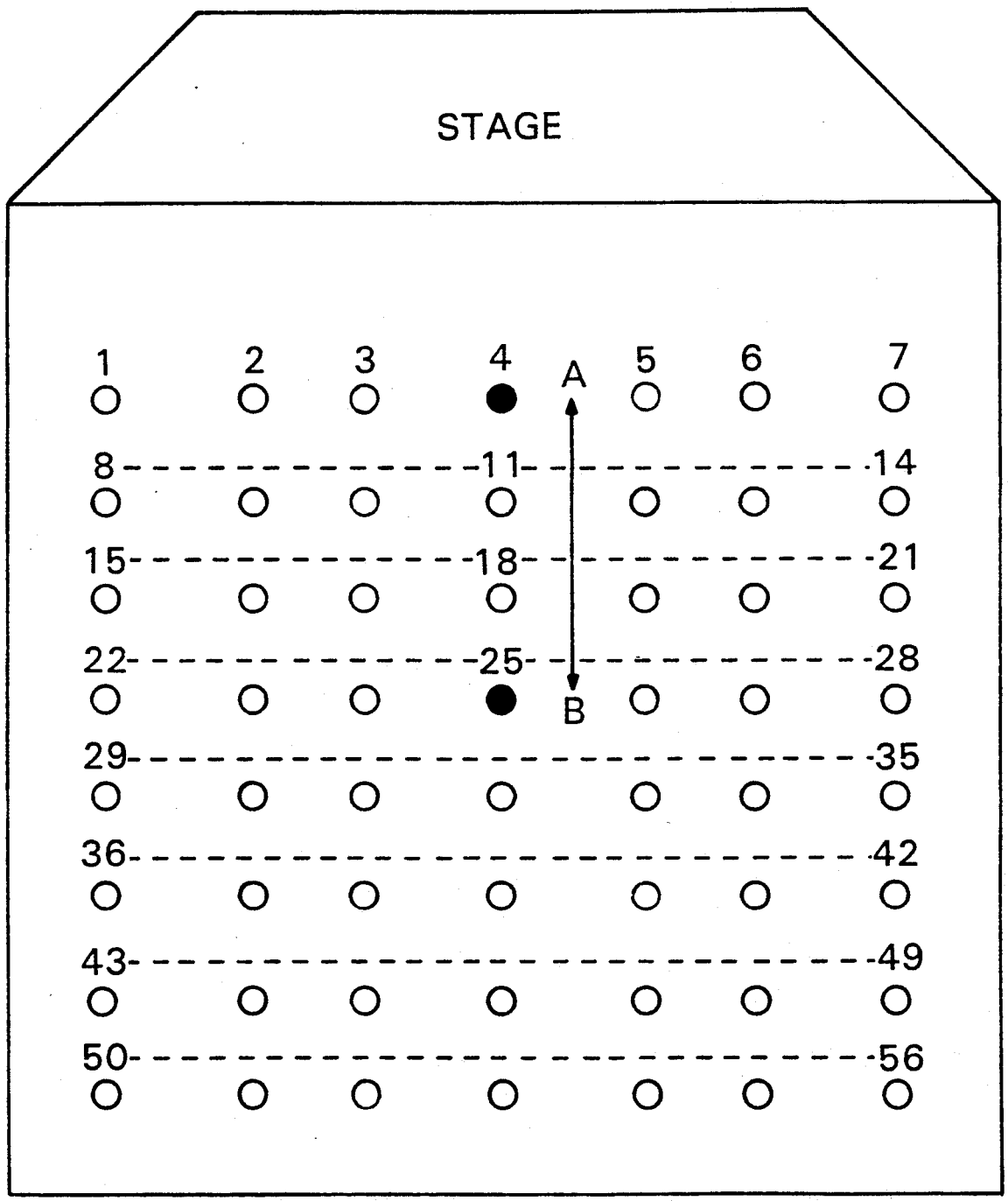
FIG. 5 is a diagram showing the listening positions in a concert hall.

The operation of switching sound field data will be described below. A continuous shift in the listening position requires a continuous processing procedure not only to change the loudness of sound but also to meet time delay and feedback requirements. FIG. 4 is a memory map of the processing instruction unit. FIG. 5 shows the listening positions of a certain concert hall. As shown in FIG. 4, the memory area is divided so as to store the processing procedures to attain the listening characteristics corresponding to the listening positions No. 1 through No. 56 shown in FIG. 5. In the case of sound field data switching, the system controller 10 sends to the second processing instruction unit 9 a code for selecting an address where a processing procedure corresponding to the sound field for a new listening position is stored. For instance, when the listening position changes from A to B in FIG. 5, the processing procedures No. 11, No. 18 and No. 25 are sequentially selected in that order on the memory map of FIG. 4. When the processing procedure No. 11 selected first and the output from the second signal processing unit 301 has been stabilized, the system controller 10 sends a switching signal to the signal switching unit 501. The signal switching unit 501 outputs the sum of the signals output from the first and second processing units 201 and 301 while reducing the level of the signal from the former and increasing the level of the signal from the latter both gradually. After a certain period of time has passed, the output from the signal switching unit 501 consists entirely of the signals from the second signal processing unit 301.

Then, the system controller 10 selects the processing procedure No. 18 of the first processing instruction unit 8, and the above operation processes are repeated alternately. Finally the processing procedure No. 25 is set in the second processing instruction unit 9. In this example, the time required for switching the processing procedure in the first processing instruction unit 8 to that in the second processing instruction unit 9 is changeable freely.

According to this example, as described above, the necessary processing procedures for continuous sound field control can be stored in the processing instruction units by a plurality of signal processing units and processing instruction units, and the system controller 10 sends only codes for selecting processing procedure, thereby enabling that the sound field can be continuously changed in real time and is free from noise at the time of data switching.

This example is described in view of continuous shifting of the listening position. It is also possible, however, to continuously vary other data of the sound field such as the movement of the sound image, change in the perspective, etc. on a real time basis by storing necessary processing procedures in the processing instruction units.

Figure 6:
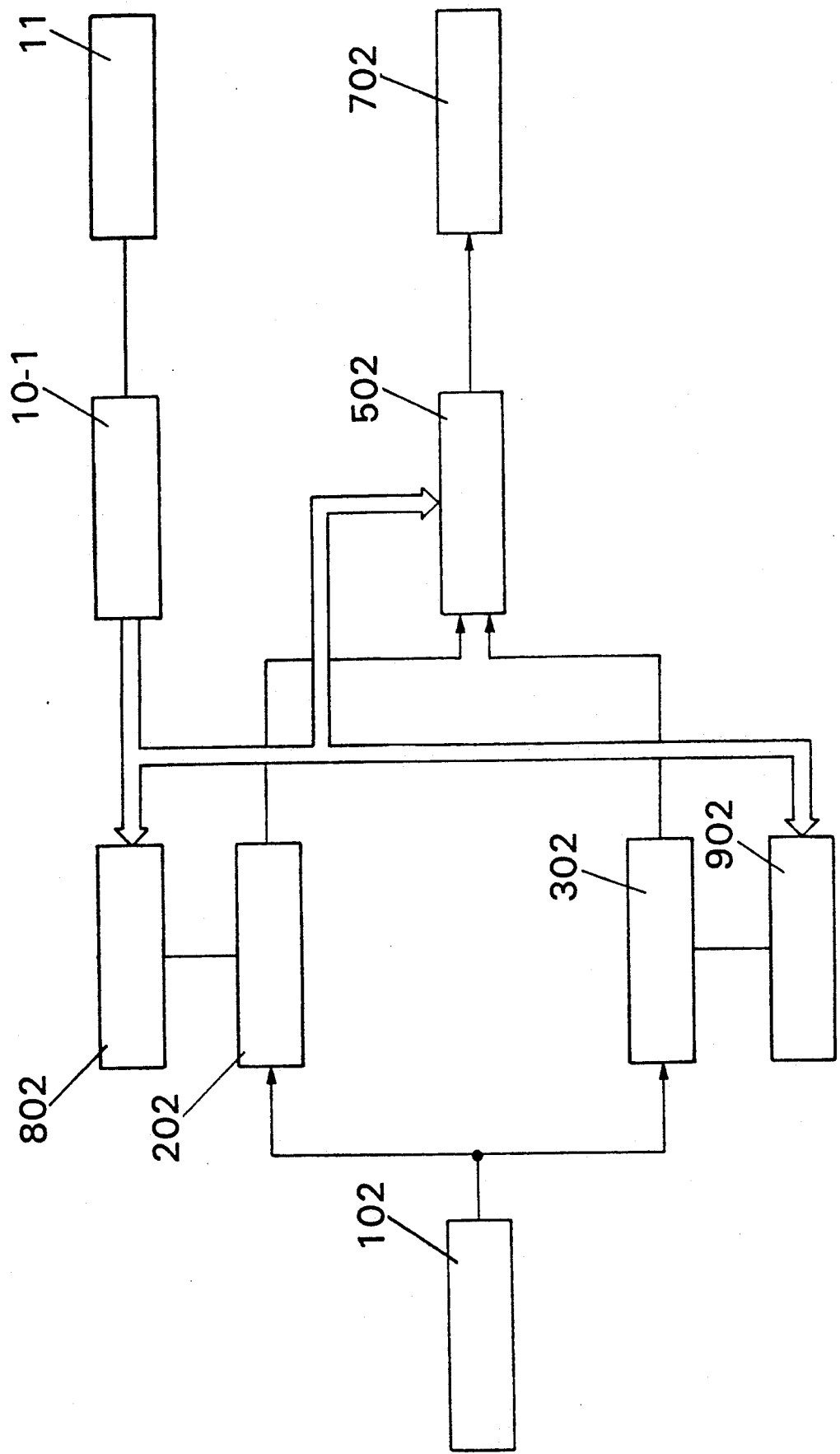
FIG. 6 is a block diagram of an apparatus for changing a sound field of a third example of this invention.

FIG. 6 is a block diagram of an apparatus for changing a sound field of the third example of this invention. The reference numeral 102 is the signal input unit for receiving digital audio signals, 202 is the first signal processing unit which processes the input digital signals by performing time delay and feedback operations on them according to a specified procedure, 302 is the second processing unit which operates in the same way as in the first signal process unit, 802 is the first processing instruction unit which gives instructions for a signal processing procedure to the signal processing unit, 902 is the second processing instruction unit, 502 is the signal switching unit for switching output signals from the first signal processing unit 202 and the second signal processing unit 302, 10-1 is the system controller for reading the codes recorded on media such as video tapes and audio tapes for processing procedure selection and for sending them to the first and second processing instruction units 802 and 902, the controller controlling also the signal switching unit 502, 702 is the digital signal output unit, and 11 is the reader for reading of the control codes from codes on media such as video tapes and audio tapes.

The operation of the apparatus for changing a sound field configured as described above will be described below. In the case of normal operation, the apparatus shown in FIG. 6 operates in the same way as in the second example of this invention. When the image of a concert hall is displayed on the screen and the listening position changes continuously as if a person were listening to the music while moving about in the hall, continuous processing procedures not only for changing simply the loudness of sound but also for satisfying time delay and feedback requirements are required. As shown in FIG. 4, the memory area is so divided as to store the procedures which attain the sound field characteristics corresponding to the listening positions No. 1 through No. 56 of FIG. 5. In the case of sound field data switching, the system controller 10-1 sends to the second processing instruction unit 902 a code for selecting an address where a processing procedure for attaining the sound field corresponding to the new listening position is stored. For instance, when the listening position changes from A to B in FIG. 5, the processing procedures No. 11, No. 18, and No. 25 are selected sequentially in that order from the memory map of FIG. 4. The processing procedure No. 11 is selected first and the output from the second signal processing unit 302 is stabilized, then, the control code reader 11 reads a control signal from the codes on video tapes or other media. The system controller 10-1 uses this control signal to actuate the signal switching unit 502. The signal switching unit 502 outputs the sum of the signals from the first and second signal processing units 202 and 302 while reducing the level of the signal from the former and increasing the level of the signal from the latter both gradually. After a certain period of time has elapsed, the output from the signal switching unit 502 is switched completely to the signals from the second signal processing unit 302.

Next, the system controller 10-1 selects the processing procedure No. 18 of the first processing instruction unit 802, and the above operation processes are repeated alternately. Finally, the processing procedure No. 25 is set in the second processing instruction unit 902.

Figure 7:
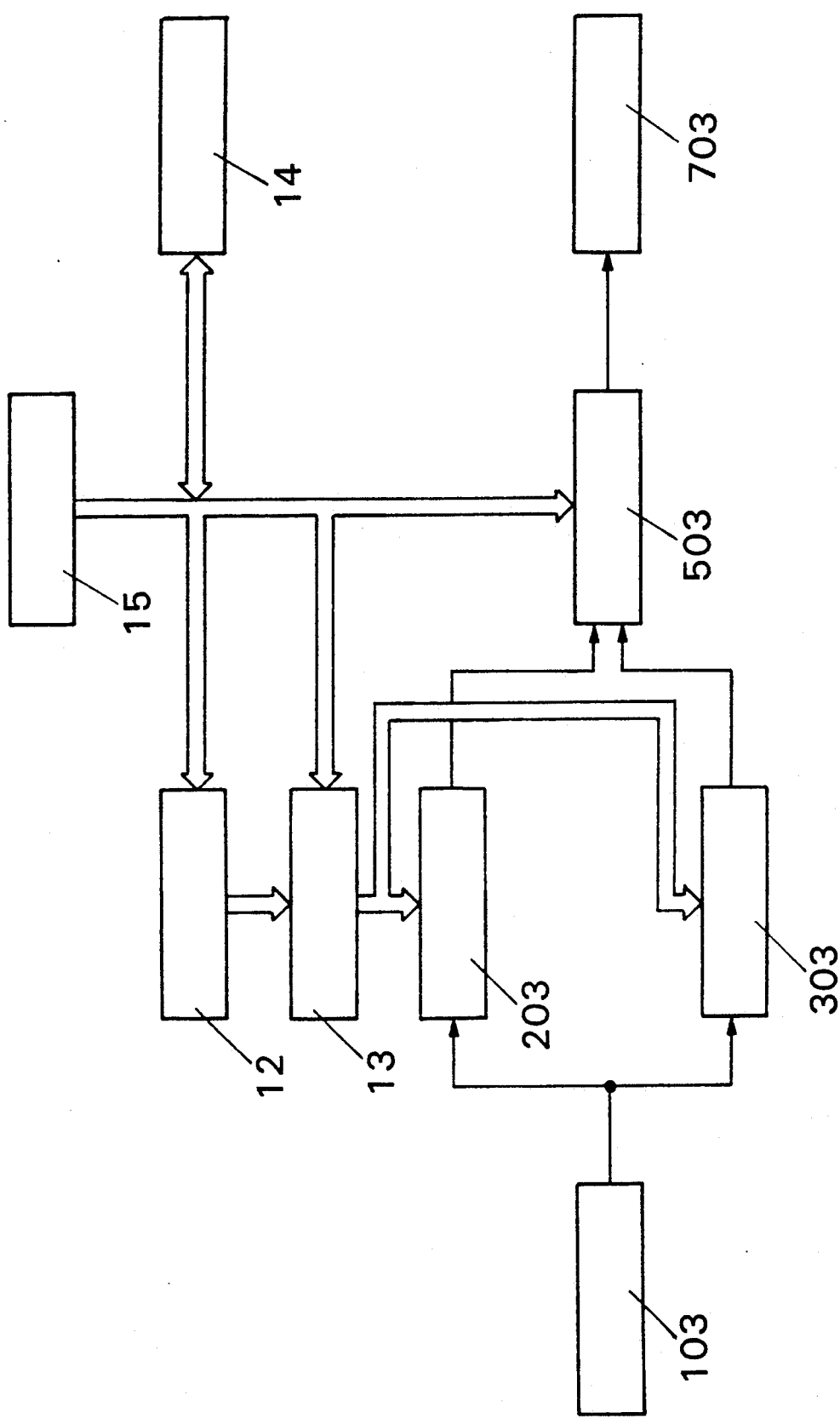
FIG. 7 is a block diagram of an apparatus for changing a sound field of a fourth example of this invention.

FIG. 7 is a block diagram of the apparatus for changing a sound field of the fourth example of this invention. The reference numeral 103 is the signal input unit for receiving digital audio signals, 703 is the signal output unit, 203 is the first signal processing unit which processes the input digital signals by performing time delay and feedback operations on them according to a specified procedure, 303 is the second signal processing unit which operates in the same way as in the first signal processor 203, 12 is the processing procedure memory which store the basic procedures for signal processing, 13 is an operation instruction unit for evaluating processing procedures by performing operations based on a certain number of basic processing procedures received from the processing procedure memory 12 and for giving instructions of the obtained processing procedures to the first and second signal processors 203 and 303, 503 is the signal switching unit for output signal switching between the first signal processing unit 203 and the second signal process unit 303, 14 is a display/input unit which displays the spacial shape of a sound field for reproduction and from which data on listening position and others are entered, and 15 is the system controller which receives information entered from the display/input unit, instructs the processing procedure memory 12 to transfer necessary basic processing procedures, instructs the operation instruction unit 13 to perform operations by delivering necessary operation parameters, and controls the signal switching unit 503.

Figure 8:
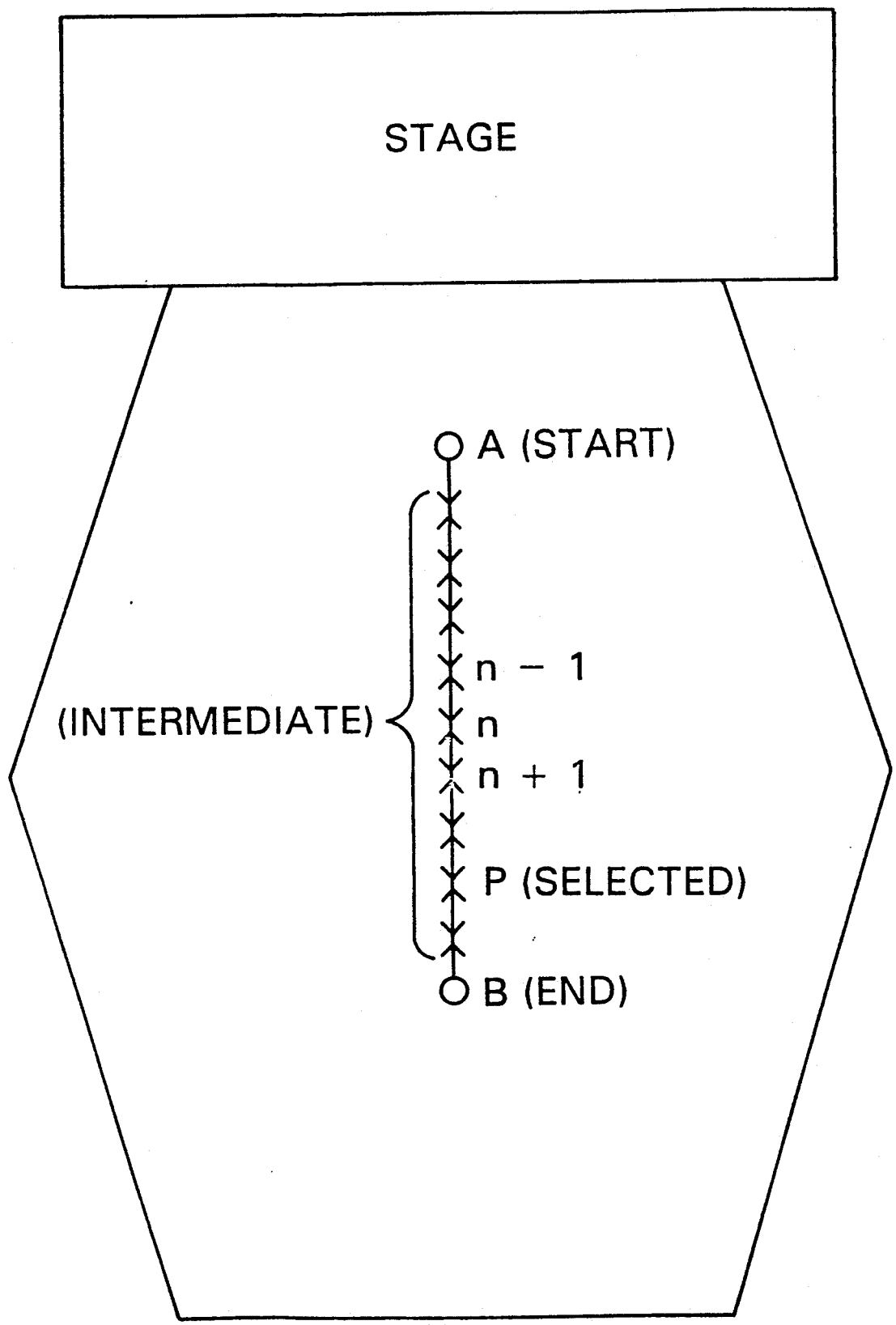
FIG. 8 is a diagram showing the markings as to the shape of a concert hall.

FIG. 8 shows an image of a concert hall to be taken as an example of the spacial shape that is displayed on the display/input unit 14, which is a component of the hardware of FIG. 7. A plan view of the concert hall is shown in this figure.

Figure 9:
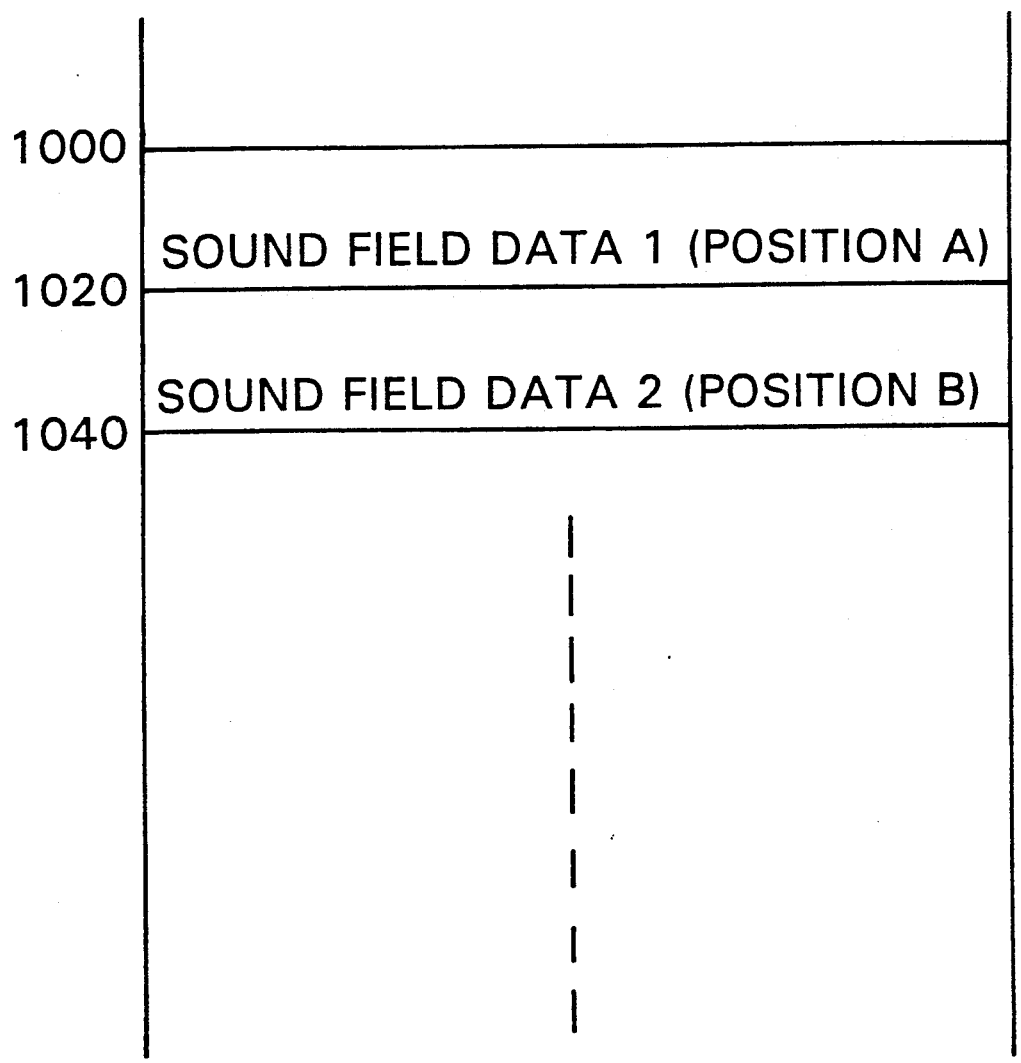
FIG. 9 is a diagram showing a memory area of a processing procedure memory means of the fourth example of this invention.

FIG. 9 gives an example of the memory area of the processing procedure memory 12, which is another component of the hardware of FIG. 7. It shows how the sound field data corresponding to the positions A (start point) and B (end point) in the plan view of the concert hall shown in FIG. 8 is stored as the basic processing procedures.

The operation of the apparatus for changing a sound field configured as mentioned above will be described below. When a certain hall is selected in the reproduced sound field menu on the display/input unit 14, the shape of the hall is displayed on the screen. Correspondingly, the system controller 15 instructs the processing procedure memory 12 to transfer the sound field data at the listening positions A and B in FIG. 8, i.e., data stored at addresses 1000 and 1020 in the memory map of FIG. 9, as the basic processing procedures for the hall. These basic processing procedures are received by the operation instruction unit 13. Simultaneously only the processing procedure corresponding, for instance, to the position A is transferred to the first signal processing unit 203. Up to this point, the signals output from the signal input unit 103 are processed by both the first and second signal processing units 203 and 303, and then the signal switching unit 503 selects only the output signal from the second signal processing unit 303. When the output signals from the first signal processing unit 203 having received the data on the position A as mentioned above are stabilized, the system controller 15 issues a switching signal to the signal switching unit 503. This signal causes the signal switching unit 503 to output the sum of the signals from the first and second signal processing units 203 and 303 while increasing the level of the signal of the former and reducing the level of the signal of the latter both gradually. In a certain period of time, the output from the signal switching unit 503 is switched completely to the signals from the signal processing unit 203.

The operation in the case of changing the listening position in the concert hall will be described below. When the position P between the positions A and B in FIG. 8 is selected at the display/input unit 14 as the listening point, the system controller 15 transfers the positional information on P to the operation instruction unit 13. The operation instruction unit 13 divides the space between the position A corresponding to the sound field of current reproduction and the position P into many points. Starting with the point nearest the position A, the sound field data for each of the many points thus produced are evaluated in sequence by performing proportional calculation based on the basic processing procedures at the positions A and B. The sound field data thus evaluated is sent to the signal processing unit in which the output of a signal is inhibited by the signal switching unit 503. For instance, if the signal from the first signal processing unit 203 is selected by the signal switching unit 503 for output and the processing procedure evaluated by the operation instruction unit 13 consists of the sound field data corresponding to the position (n−1) in FIG. 8, the processing procedure is transferred to the second signal processing unit 303. When the output from the second signal processing unit 303 is stabilized after the transfer of the processing procedure, the system controller 15 sends a switching signal to the signal switching unit 503. This causes the signal switching unit 503 to switch the output smoothly to the signal processed by the first signal processing unit 303 in the same way as mentioned above. Then, the operation instruction unit 13 evaluates the processing procedure at the position (n) in FIG. 8 and transfers it to the first signal processing unit 203. Signal switching operation which is the same as that mentioned above takes place. In this way, the processing procedure for each of the many intermediate points from the position A to the position P is evaluated with simultaneous signal processing until the sound field characteristics at the position P are finally attained. This makes it possible to change the listening position freely and continuously on a real time basis in the audio space such as a concert hall and the like. Another point to be noted is that it is required to store only the processing procedures which are necessary for performing operations.

Figure 10:
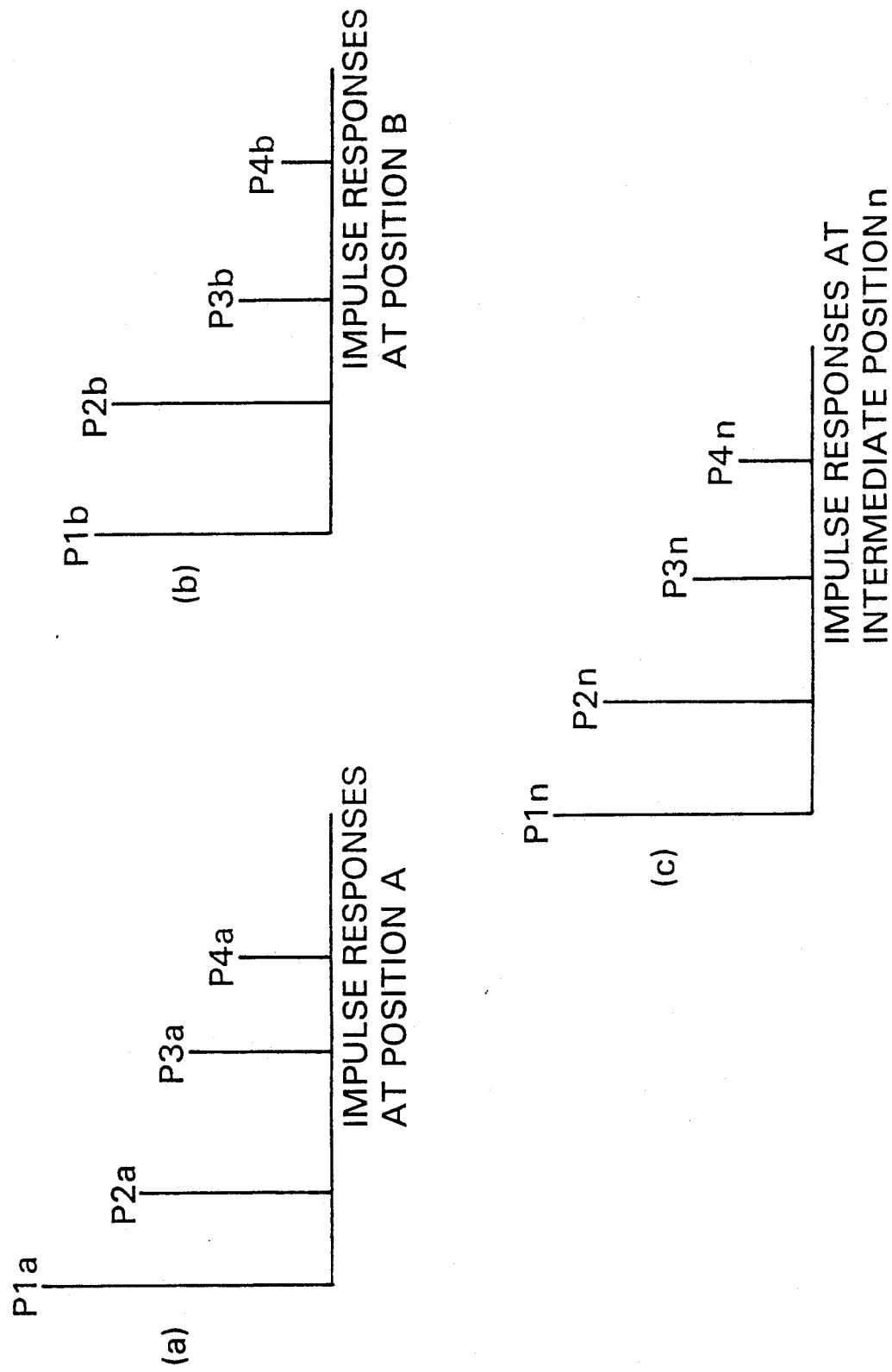
FIG. 10 shows examples of impulse responses.

FIG. 10 shows some examples of the impulse responses which represent the sound field data at the positions A and B, and examples of the impulse response at position (n) evaluated by operation. FIG. 10 assumes the reproduction of four initial reflected sound signals with a single loud speaker. The distances from the position (n) to the positions A and B are used as the parameters in operation, and PIn (I=1, 2, 3, and 4) is evaluated from PIa and PIb by linear interpolation in respect to both time delay and level.

As described above, this invention makes it possible to reproduce many sound fields using a relatively small memory capacity and also to attain extremely smooth and continuous changes in the sound field associated with the movement of the listening position. This is attained by storing sound field data on two listening points in the audio space for reproduction as the basic processing procedures and by performing operations on the two basic processing procedures to evaluate processing procedures for intermediate points between the two listening positions. The processing procedures thus evaluated are used in signal processing for sound field reproduction at applicable intermediate points. In addition, when the listening position moves, many intermediate points are set on the path of the movement and the processing procedures for these points are evaluated in sequence, and signals are switched through alternate processing by a plurality of signal processing units at every evaluation of the processing procedures.

This example of the invention attains a listening position movement in a linear pattern using two basic processing procedures. But the number of basic processing procedures is not limited to two, and the listening position movement may be two or three dimensional. In FIG. 10, processing procedure evaluation depends on linear interpolation using the distance as the parameter. But such evaluation is not restricted to this. In addition, this example processes the movement of the listening position in a concert hall. But changes in the sound field can be dealt with. For instance, the filter characteristics may be rendered continuously variable by evaluating the filter coefficient of reproduced sounds by computation.

Figure 11:
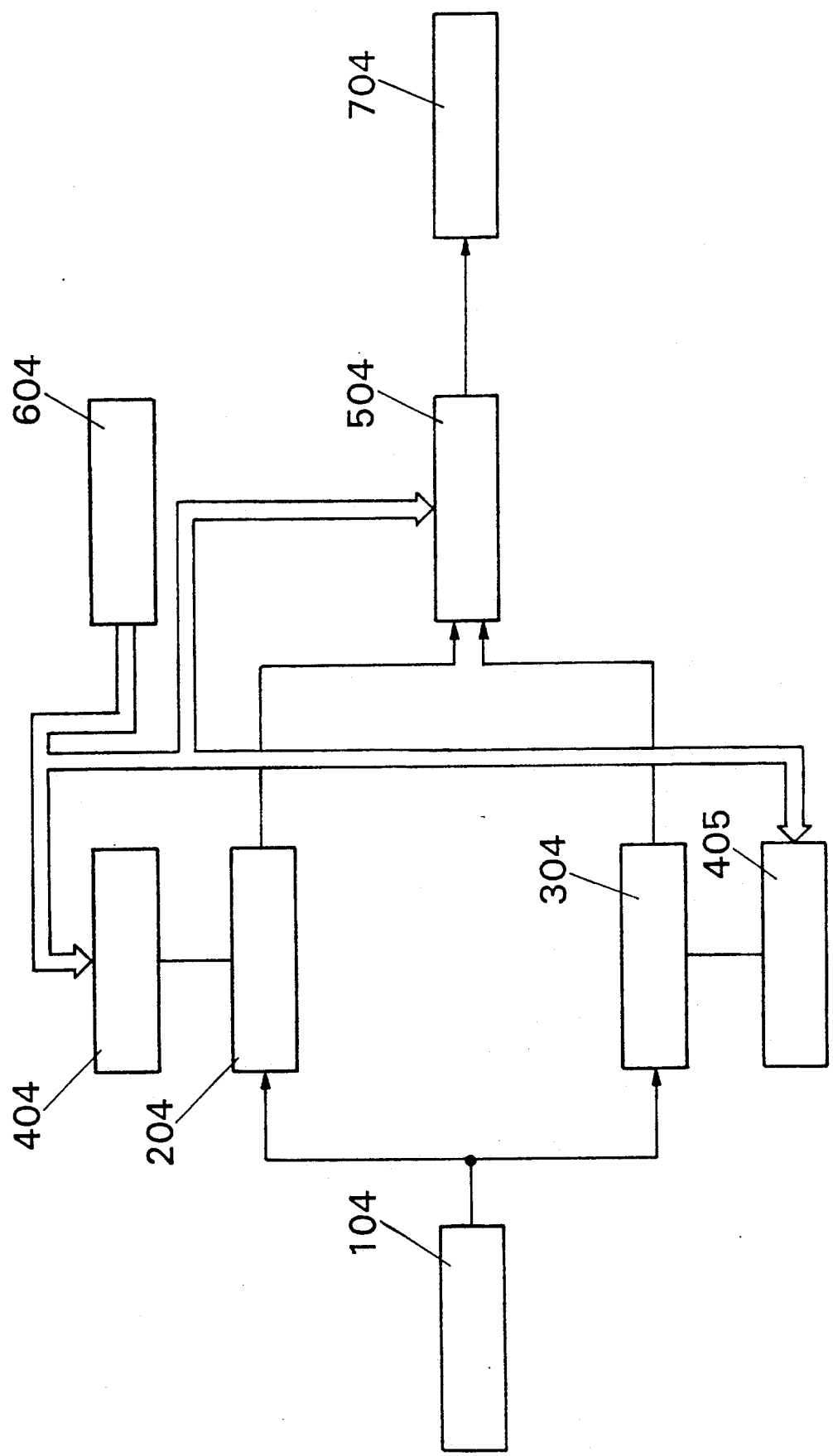
FIG. 11 is a block diagram of an apparatus for changing a sound field of a fifth example of this invention.

FIG. 11 is a block diagram of an apparatus for changing a sound field of the fifth example of this invention, the configuration of which is the same as that of the first example of this invention. The reference numeral 104 is the signal input unit for receiving digital audio signals, 204 is the first signal processing unit for processing input digital signals by performing time delay and feedback operations on them according to a specified procedure, 304 is the second signal processor which operates in the same way as in the first signal processing unit 204, 404 and 405 are the processing instruction units for giving instructions of signal processing procedures to the signal processing units, 504 is the signal switching unit for smoothly switching a plurality of output signals from the signal processing units 204 and 304 at the time of a change in the processing procedure, 604 is the system controller for modifying instructions from the processing instruction units 404 and 405 and for controlling the signal switching unit 504, and 704 is the signal output unit for passing on digital signals output from the signal switching unit 504.

The operation where a reverberation adding function is selected and reverberation data is set will be described. When the reverberation time added by this function is T0, the processing instruction unit 404 or 405 sets one n-th of this, i.e., T01 (=T00), as the reverberation time of reverberation function data.

$$T00 \leftarrow T0/n \quad (1)$$

$$T01 \leftarrow T00 \quad (2)$$

Then the signal processing unit 204 or 304 performs signal processing according to this data. In a certain period of time, the processing instruction unit 404 or 405 adds T00 to T01 and sets the sum T02 as the reverberation time in the signal processing unit 204 or 304 again.

$$T02 \leftarrow T00 + T01 \quad (3)$$

This causes the signal processing unit 204 or 304 to actuate the reverberation adding function for reverberation time of T02.

AS this processing is repeated n times, the reverberation time T0 to be actually set is set finally in the signal processing unit.

In this example of this invention, a linear change with the reverberation switching time of T is described. But this switching time may be non-linear.

Figure 12:
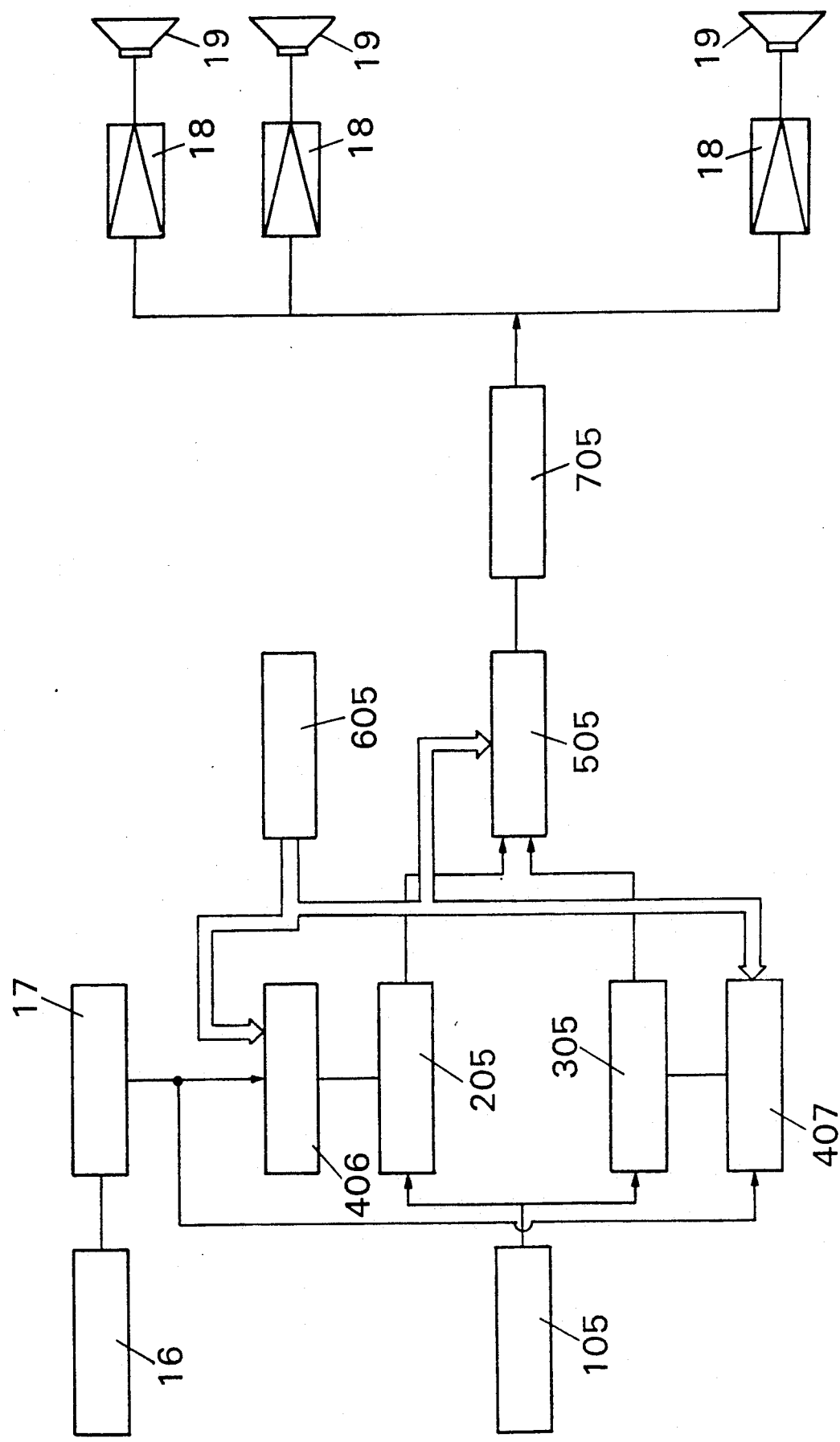
FIG. 12 is a block diagram of an apparatus for changing a sound field of a sixth example of this invention.

FIG. 12 is a block diagram of an apparatus for changing a sound field of the sixth example of this invention. The reference numeral 105 is the signal input unit for receiving digital audio signals, 205 is the first signal processing unit for processing the input digital signals by performing time delay and feedback operations on them according to a specified procedure, 305 is the second signal processing unit which operates in the same way as in the first signal processing unit, 406 and 407 are the processing instruction units for giving instructions of signal processing procedures to the signal processing units, 505 is the signal switching unit for smoothly switching a plurality of output signals from the signal processing units 205 and 305 at the time of a change in the processing procedure, 605 is the system controller for modifying instructions from the processing instruction units 406 and 407 and for controlling the signal switching unit 505, 705 is the signal output unit for passing on digital signals output from the signal switching unit 505, 16 is a variable resistor group, 17 is a resistance converter, 18 is an amplifier, and 19 is a loud speaker unit.

The operation of this apparatus configured as described above will be described below. The resistance converter 17 detects the direction of sound image movement according to the resistance measured using the variable resistance group 16. The delay time, amplitude, etc. necessary for orienting the sound image are then evaluated for each reproduction speaker unit and set in the processing instruction unit 406 or 407. The processing instruction unit 406 or 407 converts them into data items acceptable by the signal processing unit 205 or 305 and sets them therein for signal processing. The signals having been processed in terms of time delay, amplitude, etc. are output from the speaker unit 19 through the signal output unit 705 and amplifier 18.

Figure 13:
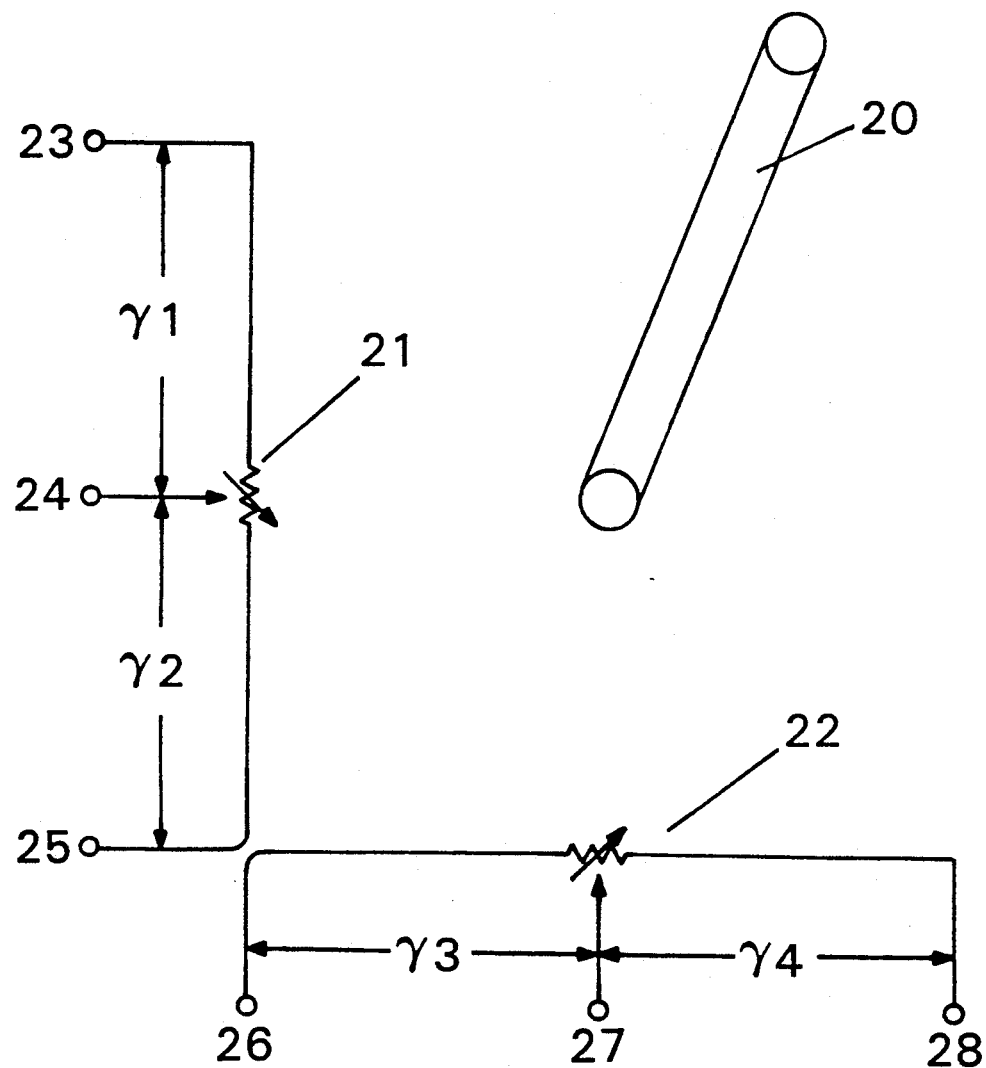
FIG. 13 is a diagram showing an example of variable resistances used in the sixth example of this invention.
Figure 14:
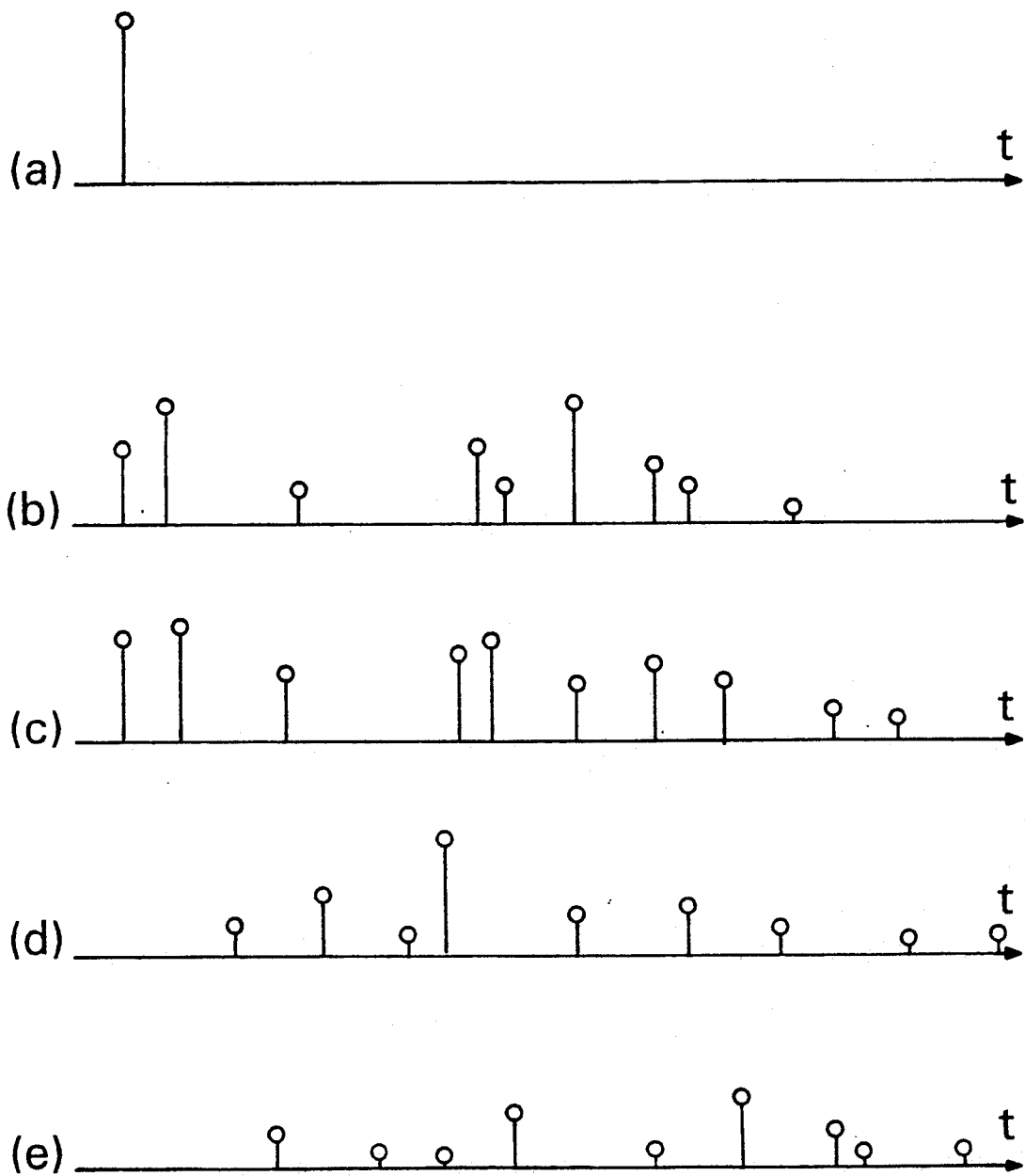
FIG. 14 is a diagram showing some examples of output signals for reproducing a sound field corresponding to input signals.

An example of operation of the variable resistors which constitute the variable resistor group 16 is given below, with reference to FIG. 13. For instance, the variable resistor group configuration shown in FIG. 13 is applicable for two-dimensional sound field space control. The reference numeral 20 is a control rod, 21 and 22 are variable resistors, 23, 24, 25, 26, 27 and 28 are terminals. The terminal on each end of the variable resistors 21 and 22 are fixed, but the terminals in the middle are designed to change their position according to the movement of the control rod 20. Therefore, they make it possible to indicate the position vector decomposed in the longitudinal and lateral directions of the control rod. As for the vector in the longitudinal direction, the terminal 24 in the middle of the variable resistor 21 is used to detect the resistances between the terminals 23 and 24 and between the terminals 25 and 24, and the voltage r1 across the terminals 23 and 24, and the voltage r2 across the terminals 25 and 24 are measured. As for the vector in the lateral direction, the terminal 26 in the middle of the variable resistor 22 is used similarly to detect the resistance between the terminals 26 and 27 and between the terminals 27 and 28, and the voltage r3 across the terminals 26 and 27 and the voltage r4 across the terminals 27 and 28 are measured. In this way, the vector in the longitudinal direction is represented by the two variables r1 and r2. The vector in the lateral direction is represented by the two variables r3 and r4. Finally the position vector of the control rod is determined by the four variables in total.

Instead of using the resistance converter 17 mentioned above, it is possible to calculate in advance the delay time, amplitude, etc. necessary for sound image orientation for each reproduction speaker unit and to store the results in a ROM table. This will contribute to improvement of the performance of operation and simplification of the hardware configuration.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. An apparatus for changing a sound field comprising:
    a signal input means for receiving digital audio signals reproduced by a sound reproducing device;
    at least two signal processing means for processing the input digital signals by performing time delay and feedback operations on them according to a predetermined procedure;
    a processing instruction means for giving instructions to said signal processing means as to the way of processing the signals;
    a signal switching means for smoothly switching signals output from a plurality of said signal processing means at the time of a change in the processing procedure;
    a system control means for modifying the instructions of said processing instruction means and for controlling said signal switching means; and
    a signal output means for delivering digital signals output from said signal switching means.

2. An apparatus according to claim 1, wherein a plurality of processing procedures for controlling a sound field are stored in advance in said processing instruction means, and said system control means produces codes for selecting processing instruction means, thereby one processing procedure is switched to another for a signal processing operation.

3. An apparatus according to claim 1, further comprising a variable resistor group which consists of a plurality of variable resistors for changing resistance values in accordance with a specific relation, and a resistance converting means for obtaining parameters based on said resistance values.

4. An apparatus according to claim 3, wherein said resistance converting means comprises a ROM table for storing parameters which are calculated beforehand.

5. An apparatus for changing a sound field comprising:
    a signal input means for receiving digital audio signals reproduced by an audio-visual reproducing device;
    at least two signal processing means for processing the input digital signals by performing time delay and feedback operations in accordance with a predetermined procedure;
    a processing instruction means for giving instructions to said signal processing means as to the way of processing the input signals;
    a signal changing means for smoothly switching signals output from a plurality of said signal processing means at the time of a change in a processing procedure;
    a system control means for reading sound control codes on media in which image signals are stored, each of which codes corresponds to a single image, or for reading sound control codes on other media synchronized in frame, and sending them to said processing instruction means, and also for controlling said signal switching means; and
    a signal output means for delivering digital signals output from said signal switching means.

6. An apparatus according to claim 5, wherein a plurality of processing procedures for controlling a sound field are stored in advance in said processing instruction means, and said system control means produces codes for selecting processing instruction means, thereby one processing procedure is switched to another for a signal processing operation.

7. An apparatus according to claim 5, further comprising a variable resistor group which consists of a plurality of variable resistors for changing resistance values in accordance with a specific relation, and a resistance converting means for obtaining parameters based on said resistance values.

8. An apparatus according to claim 7, wherein said resistance converting means comprises a ROM table for storing parameters which are calculated beforehand.

9. An apparatus for changing a sound field comprising:
    a signal input means for receiving digital audio signals reproduced by a sound reproducing device;
    a plurality of signal processing means for processing the input digital signals by performing time delay and feedback operations on them according to a predetermined procedure;
    a processing procedure memory means for storing a plurality of basic processing procedures;
    an operation instruction means for performing operations such as interpolation based on the basic processing procedures sent from said processing procedure memory means so as to obtain a processing procedure, and for sending the obtained processing procedure to said signal processing means;
    a signal switching means for smoothly switching signals output from a plurality of said signal processing means at the time of a change in the processing procedure;
    a system control means for modifying the instructions on the processing procedure and for controlling the operation instruction means and the signal switching means; and
    a signal output means for outputting digital signals output from said signal switching means.

10. An apparatus according to claim 9, wherein a plurality of processing procedures for controlling a sound field are stored in advance in said processing instruction means, and said system control means produces codes for selecting processing instruction means, thereby a processing procedure is switched to another for a signal processing operation.

11. An apparatus according to claim 9, further comprising a variable resistor group which consists of a plurality of variable resistors for changing resistance values in accordance with a specific relation, and a resistance converting means for obtaining parameters based on said resistance values.

12. An apparatus according to claim 11, wherein said resistance converting means comprises a ROM table for storing parameters which are calculated beforehand.

13. An apparatus according to claim 9, further comprising a display unit for displaying a spacial shape corresponding to a sound field to be reproduced and an input unit through which listening points are input, wherein said processing procedure memory means stores basic processing procedures for reproduction of sound fields at several typical points in said space, and a processing procedure for reproduction of a sound field corresponding to the listening point input through said input unit is evaluated from the basic processing procedures by means of said operation instruction means.

14. An apparatus for changing a sound field comprising:

a signal input means for receiving digital audio signals reproduced by a sound reproducing device;

at least two signal processing means for processing the input digital signals by performing time delay and feedback operations on them according to a predetermined procedure;

a processing instruction means for dividing reverberation time by a certain period of time, in the case of generating a reverberation signal to be sent to the signal processing means, whereby the reverberation time is gradually increased to obtain the reverberation time to be actually set;

a signal switching means for smoothly switching signals output from the signal processing means at the time of a change in the processing procedure;

a system control means for modifying the instructions of said processing instruction means and for controlling said signal switching means; and a signal output means for delivering digital signals output from said signal switching means.

* * * * *